(12) United States Patent
Shurvinton et al.

(10) Patent No.: US 7,450,907 B2
(45) Date of Patent: Nov. 11, 2008

(54) POWER CONTROL DEVICE AND METHOD FOR CALIBRATING THE POWER OF A TRANSMITTER OR RECEIVER IN A MOBILE COMMUNICATION NETWORK

(75) Inventors: Bill William Shurvinton, Hook (GB); David Spink, Sunninghill (GB)

(73) Assignee: Nokia Corporation, Espoo (FI)

( * ) Notice: Subject to any disclaimer, the term of this patent is extended or adjusted under 35 U.S.C. 154(b) by 209 days.

(21) Appl. No.: 10/506,627

(22) PCT Filed: Mar. 7, 2002

(86) PCT No.: PCT/EP02/02518

§ 371 (c)(1), (2), (4) Date: Oct. 27, 2004

(87) PCT Pub. No.: WO03/075485

PCT Pub. Date: Sep. 12, 2003

(65) Prior Publication Data

US 2005/0130595 A1    Jun. 16, 2005

(51) Int. Cl.
*H04B 17/00* (2006.01)
(52) U.S. Cl. .............. 455/67.11; 455/78; 455/522; 370/328
(58) Field of Classification Search .......... 455/67.11, 455/78, 83, 522, 126, 69; 370/328
See application file for complete search history.

(56) References Cited

U.S. PATENT DOCUMENTS 5,542,096 A * 7/1996 Cygan et al. ............. 455/115.2

7,139,324 B1 * 11/2006 Ylitalo et al. ............. 375/267
2002/0177417 A1 * 11/2002 Visser ........................ 455/83
2003/0068984 A1 * 4/2003 Shin et al. .................. 455/69

FOREIGN PATENT DOCUMENTS

| EP | 0 461 314 A1 | 12/1991 |
| EP | 0 684 707 A1 | 11/1995 |
| EP | 0 461 314 | * 12/1999 |

OTHER PUBLICATIONS

ETSI (European Telecommunications Standards Institute), Draft pr ETS 300 579, May 1996, Sixth Edition, GSM, "Digital Cellular Telecommunications System (Phase 2); Radio Subsystem Synchronisation (GSM 05.10)", Source: ETSI TC-SMG Reference: RE/SMG-020510PR5, p. 1-15.

(Continued)

*Primary Examiner*—Nay Maung
*Assistant Examiner*—Tuan H Nguyen
(74) *Attorney, Agent, or Firm*—Squire, Sanders & Dempsey, LLP

(57) ABSTRACT

The invention relates to a power control device and method for calibrating the power of a transmitter or receiver in a mobile communication network comprising an antenna array, wherein burst signals are transmitted to, or received by, the antenna array. The calibration of the transmission or receiving power of the transmitter or receiver includes a summing step for summing transmission or reception signals of the antenna array, and a common calibrating step for commonly calibrating the summed signals.

22 Claims, 8 Drawing Sheets

OTHER PUBLICATIONS

ETSI, Draft pr ETS 300 577, Jul. 1999, Fifteenth Edition, GSM, "Digital Cellular Telecommunications System (Phase 2); Radio Transmission and Reception (GSM 05.05 version 4.23.0)", Source: SMG, Reference: RE/SMG-020505PRE, pp. 1-47.

ETSI, EN 300 908 V6.3.1 (Mar. 1999), Digital cellular telecommunications system (Phase 2+); Multiplexing and multiple access on the radio path (GSM 05.02 version 6.3.1 Release 1997), pp. 1-51.

* cited by examiner

RF BLOCK ARCHITECTURE

CORRELATION PEAK WITH AND WITHOUT TIMING OFFSET

POWER CONTROL DEVICE AND METHOD FOR CALIBRATING THE POWER OF A TRANSMITTER OR RECEIVER IN A MOBILE COMMUNICATION NETWORK

FIELD AND BACKGROUND OF THE INVENTION

The invention relates to a power control device and method for calibrating the power of a transmitter or receiver of a mobile communication network in which burst signals are applied to the transmitter. The burst signals include a fixed training sequence.

More generally, the invention relates to Power Control, in particular Digital Power Control of a transmitter such as a Transceiver (TRX, e.g. Transceiver Card) or a BTS (Base Transceiver Station) Transmitter. More specifically, the invention aims at providing a power control function applicable to a device, system, and method requiring power calibration.

In existing GSM compatible basestations, Power Control is implemented by a combination of two methods: closed loop, when the transmitter is on, and open loop when the transmitter is off. The closed loop mode is a real time control in which the output power is sampled and compared to a reference signal, and the gain is corrected. The closed loop part of the power control operation is also used to control the ramp shape between timeslots so that the power versus time mask is met.

The open loop part of the power control function is used in the off period between timeslots as the linear range of the output detector limits the closed loop operation.

In the standard GSM system, with a constant RF (Radio Frequency) envelope, power control can be easily carried out utilizing an integrator as a loop filter. If there is any ripple on the envelope, the integrator, depending upon the loop bandwidth, attempts to recover the variation on the envelope by altering the attenuation on the RF path. However, the analog (closed loop) power control schemes as used with GMSK (Gaussian Minimum Shift Keying), have difficulty with EDGE (Enhanced Data for GSM Evolution) 8PSK modulation, as the signal has no longer a constant envelope.

The analog power control has been enhanced for EDGE by adding a replica of the modulation envelope onto the power control voltage and comparing it to the detected voltage. Switching the loop bandwidth during the burst enables this scheme to meet the ramping requirements of GSM, make the power control scheme less sensitive to delay and minimise amplitude error.

As mentioned above, the analog scheme requires a combination of closed loop and open loop control as the linear range of the detector is not sufficient for the Tx Off state (Tx=transmitter). Such as solution is difficult to implement and often causes distortion of the signal due to switching transients caused by the switching of the loop bandwidth. Transients may also occur when switching between closed loop and open loop operation as the detector range is not sufficient to detect the whole envelope. Additionally, as the power ramping is controlled by the closed loop, overshoot of the ramp often occurs, giving type approval difficulties.

Further, when building a smart antenna (SA) BTS utilising beam steering the relative losses and phase lengths between the N columns of the array are critical to performance. These relative differences are not constant over time, temperature and frequency. The phase length and losses need to be measured in a non-obtrusive fashion to meet type approval requirements. The measurement and adjustment of these differences needs to be automatic.

In the past, beam steering systems have tended to use individual RF line-ups for each transmit path, with the calibration being performed in the baseband processing, which has resulted in very expensive systems.

SUMMARY OF THE INVENTION

The invention provides a device and/or method with enhanced possibility of effective and yet simple power calibration.

The present invention provides a device and/or method as defined in the independent claims or any of the dependent claims.

The phase lengths and losses between the N columns of a smart antenna (SA) BTS utilising beam steering can be measured in a non-obtrusive fashion. The measurement and adjustment of these differences is performed automatically so as to provide good performance.

The invention provides a simple and effective calibration system and method.

In accordance with the invention, a single RF lineup can exist from baseband up to final RF, where the signal is split and fed to the phasing/gain control network.

The measurement of calibration preferably has two parts, TX and Rx. Both use a simple passive coupling network in the antenna array and a calibration board which works at mobile frequencies (e.g. the RF from a mobile).

To calibrate the transmit side the BTS may preferably transmit GSM dummy bursts to the calibration board. To calibrate the Receive side the calibration board may transmit dummy bursts to the BTS. With some DSP processing the relative gain and phase values can then be calculated. The means, e.g. chipset, of a mobile terminal can be used for the calibration.

In accordance with a preferred implementation of the invention, the training sequence (also known as midamble) is used to measure power.

Digital ramping may be used with the baseband functions. The power control is working open loop at all times. Therefore, the problems related to EDGE envelope variations are removed.

The digital Power Calibration and control loop according to a preferred implementation of the invention as described above and below removes the above mentioned problems.

The power control may use the training sequence to set the power control and may be employed with any appropriate type of modulation, e.g. Edge or GMSK modulation. This feature, preferably as part of a system using digital ramping techniques, allows a simple and low cost power control system to be implemented.

The Digital Power Control scheme according to the invention is different from the existing Analog scheme. The power is controlled in open loop mode, i.e. no power corrections are made during the measured timeslot. The output power is set on the basis of information measured in the previous timeslot.

The Digital Power Control method also has some advantages in that can it be utilised when implementing a power control method for multicarrier transmitter.

The Digital Power Control method operates in an open loop basis, using the midamble of the burst for power measurement. Compared to the analog power control used e.g. for 8-PSK modulated signal, the controlling circuit is open, thus there is no realtime feedback circuit to the controller. The method and device according to the invention does not suffer from the problems of the analog ones.

Monitoring the known midamble will give an exact information on the output power, provided that, as usual, the measuring circuit (integrator, integration time, zeroing) works properly and does not produce any error.

As the system is open loop, in that no adjustments are performed during the measured burst, there is a reduction in the dynamic range requirements of the lineariser. As power ramping is performed in the digital domain, over- or under-shooting of the ramping waveform does not occur. Further, the same power control system can be used with any modulation scheme, provided that it has a known midamble.

Further, the number of parts required to implement the Tx lineup is reduced, reducing costs.

DETAILED DESCRIPTION OF PREFERRED EMBODIMENTS OF THE INVENTION

The described Digital Power Calibration and/or Control scheme in accordance with the invention is for instance applicable in a GSM transceiver. The power calibration and/or control method and devices are designed and applicable for Smart Antenna applications or non Smart Antenna applications. Generally, a smart antenna system combines multiple antenna elements with a signal-processing capability to optimize its radiation and/or reception pattern automatically in response to the signal environment.

The purpose of the power control system is to control the output power of the transmitter in several steps, e.g. sixteen steps of 2 dB. Power control is also responsible for meeting the power versus time requirements and switching transient requirements specified in the Digital Cellular Telecommunications System (Phase 2+) for GSM (Global System for Mobile Communications).

According to a preferred implementation of the invention, the output of the Power Amplifier is detected during the training sequence, averaged using an integrator, and then digitised with an ADC (Analog to Digital Converter). This digitised signal is fed to the power control algorithm which can be implemented as hardware, e.g. an ASIC (Application Specific Integrated Circuit), or in software, e.g. residing in an embedded processor. The algorithm compares the measured output to the desired signal level, and forms an error signal which steps the RF attenuator to the correct level.

Figure 1:
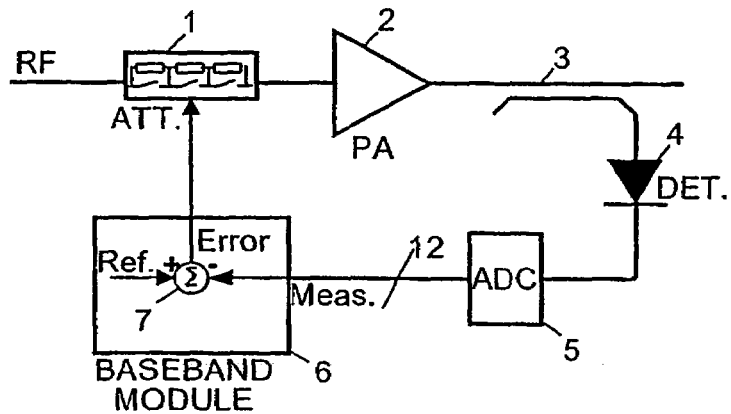
FIG. 1 illustrates a first embodiment of the invention which comprises a basic control loop.

FIG. 1 shows an embodiment of the invention employing such a structure and functioning.

The power control device of FIG. 1 includes an attenuator 1 to which the RF signal to be applied to an antenna (not shown) is supplied. The attenuator 1 is controllable as regards its gain, and applies its output, e.g. the power-controlled RF signal, to a power amplifier (PA) 2 having its output connected to a line 3 which leads to the antenna. For power detection, a detector circuit 4, such as a diode detector circuit is coupled to the PA output (line 3) via an appropriate coupling means such as a directional coupler. The analog output signal of detector circuit 4 is supplied to an analog-digital converter (ADC) 5 either directly or preferably via an integrating or averaging means. The output of the ADC 5 is applied to a baseband module 6 and represents the measured power level.

The baseband module 6 includes an error correction device such as the shown summing means 7 which receives the output signal of ADC e.g. at its inverting input, and a reference value representing the desired power level, e.g at its non-inverting input. The resulting error signal output from summing means 7 is applied to the control input of attenuator 1 for controlling its gain appropriately.

There are four main fundamental features (implementable either solely or in arbitrary combination) within the digital power control design according to the shown embodiments which are:

Baseband Ramping within the control means;

Open Loop Static Control (e.g. Power Levels 0 to 6);

Dynamic Control set within the control means (e.g. Power Levels 7 to 15);

Estimation of output Power is based upon the digitised Training Sequence of the output signal.

These features are explained in more detail in the following.

The Baseband Ramping is achieved in an appropriate element such as in the transceiver, e.g. in an ASIC chip.

The output of the modulator is digitally multiplied by a programmable smooth ramp profile, which brings up the power gradually to avoid switching transients. This ramped digital signal is then used as the input to a DAC (Digital to Analog Converter)—the output of which can be up-converted and amplified to the correct level. The output signal of this DAC may represent the desired value "Ref." applied to summing means 7 as shown in FIG. 1.

The power ramp is generated in a DDS (Direct Digital Synthesis) structure and is synchronized to the falling edge of the Power Control Scheme clock, e.g. PWC (Pulse Width Control) clock. The power ramp goes down between timeslots in all cases. The Power control unit gets its timing, slope and power level information preferably from a power control table e.g. within the ASIC.

As regards Open Loop Static Power Level Control, the control of the static power levels, Power Levels 0 to 6, may e.g. be effected by a single attenuator, e.g. a 30 dB, 2 dB step digital Attenuator, at RF (Radio Frequency). The attenuator receives its information from the ASIC. This attenuator is also used to take out unit to unit variations in components and the effects of temperature variations. The static power control serves to reduce DAC dynamic range requirements.

The Dynamic Power Level Control is effected in the power control means, preferably using a basic structure as shown in FIG. 1. Preferably, a digital multiplier, before the modulator output, sets the output power for dynamic levels PL7 to PL15 (PL=Power Level).

As regards Training Sequence Detection, rather than trying to detect the whole envelope of the timeslot, the invention preferably detects only the midamble training sequence. The training sequence is a fixed bit sequence which compensates for the effects of multipath fading and allows synchronisation. The output of the detector is then preferably averaged using an integrator and then converted to a digital signal of e.g. 12 bit.

Figure 2:
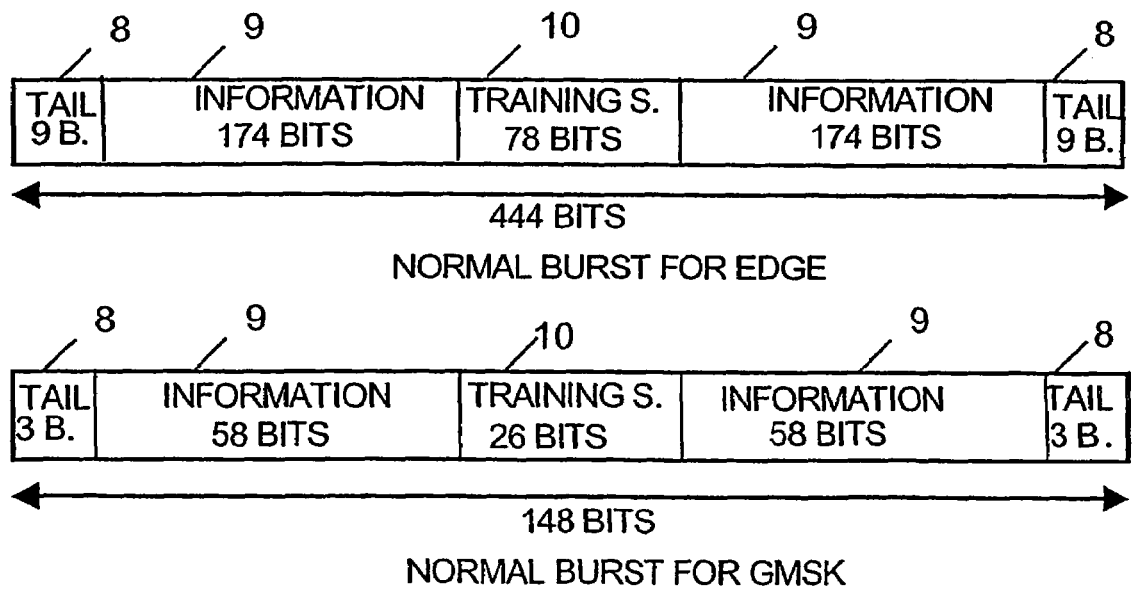
FIG. 2 shows the structures of normal bursts for EDGE and GMSK.

FIG. 2 shows the structure, in the time domain, of a normal burst of data for both EDGE and GSM. The position of the training sequence (midamble) within each burst is highlighted.

The bursts for EDGE or GMSK are standardised and include tails 8 at the beginning and end, a midamble (training sequence) 10 in the midst of the burst signals, and information sections 9 between the training sequence 10 and the tails 8. FIG. 2 indicates the bit lengths of the individual sections of the bursts, as well as the total bit lengths of the bursts.

This approach has two main advantages. Firstly the position of the training sequence and its duration within the burst are fixed and secondly a diode detector circuit is able to detect the output power for all output power levels.

The embodiment preferably comprises only a single power control loop.

A simplified version of the power control algorithm is suitable for inclusion in the power control means; e.g. ASIC. As before, the power control compares the required output power with the measured power, and appropriately steps the attenuator and digital multiplier within the power control chip, e.g. ASIC.

Figure 3:
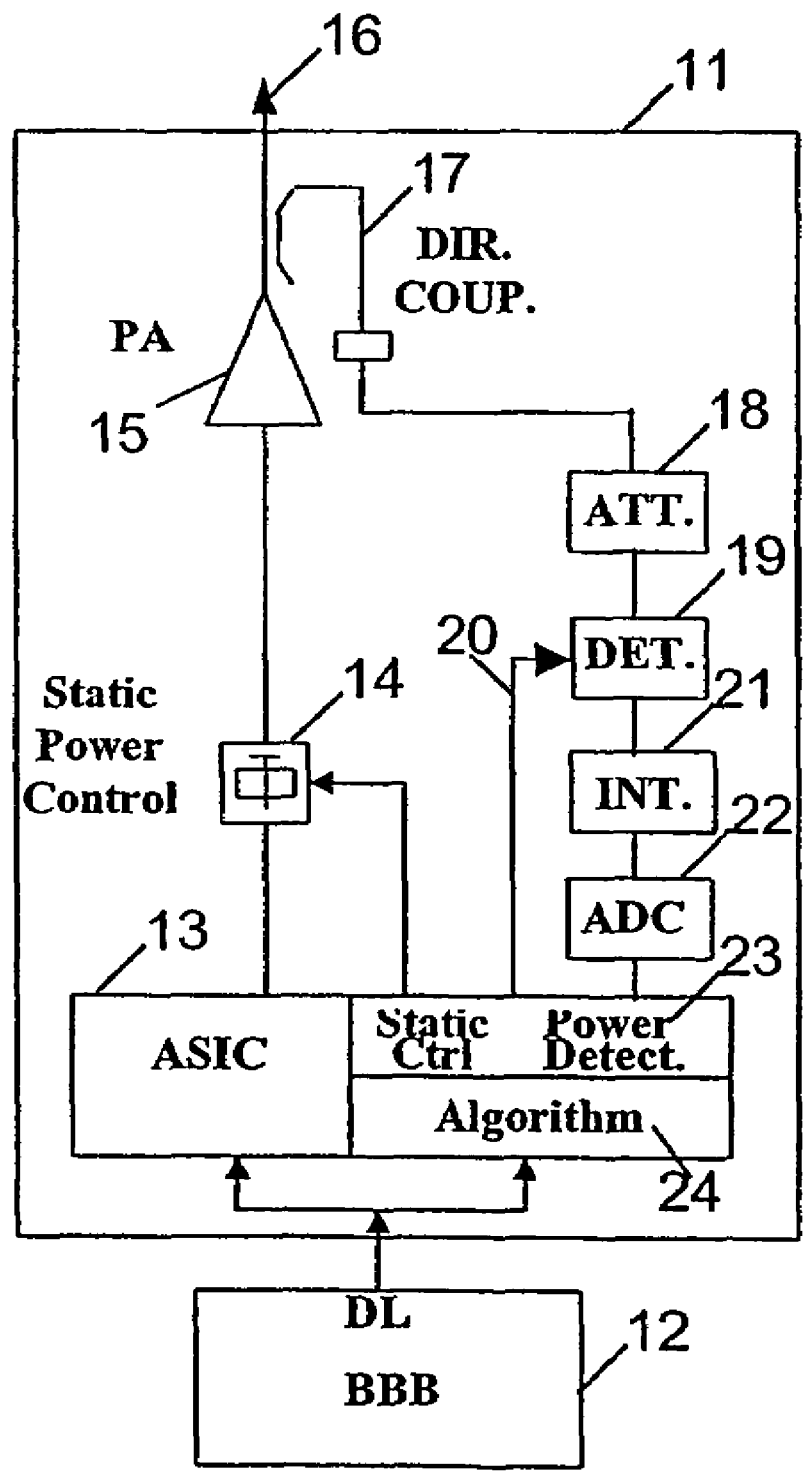
FIG. 3 illustrates a further embodiment of the present invention including a single control loop.

FIG. 3 shows the main components of a single control loop.

The power control shown in FIG. 3 includes a power control means 11 which is connected to a baseband module (baseband board BBB) 12 which may be similar to baseband module 6 of FIG. 1 and which applies, at its output DL, appropriate signals to the power control means 11. The power control means 11 includes a transmitter chip 13 which may be an ASIC or an embedded processor. A static power control means 14 such as a controllable amplifier or attenuator is connected to the RF output of chip 13. The output of static power control means 14 is connected to the input of power amplifier 15 which outputs the signals to be transmitted to an output 16 connected to one or more antennas (not shown).

The power control means 11 comprises a directional coupler 17 for sensing the output power of power amplifier 15, an attenuator means 18, a detector means 19, an integrator 21, an ADC (Analog to Digital Converter) 22, a power detection section 23, and an algorithm section 24. The power detection section 23 comprises a static control part issuing a control signal to static power control means 14 for controlling the actual static power control level, as well as a power detection section issuing a control signal which is applied, via line 20, to the control input of detector means 19.

The power detection section 23 generates the control signal on line 20 with a timing so as to operate the detection section.19 only when the power amplifier outputs the midamble (training sequence) 10 shown in FIG. 2.

Therefore, the detector means 19 is controlled using a time-window for activating the detection,section only during training sequence, and for stopping the detection function of detector means during the other times of the time slot signal (tails 8 and information sectors 9 as shown in FIG. 2). As the bit difference, and therefore the time difference, between start of a burst (starting with the front tail 8) and the begin of the training sequence 10 is fixed for every burst, the control section 23 can easily generate the control signal on line 20 by providing a time delay between start of a burst and start of the control signal sufficient so as to open the detection function of detector means 19 only when the first bits of the midamble are occurring at the input of the detector means 19. Likewise, the time window for detecting the PA output signal is closed at or before the occurrence of the last bits of the midamble 10, the total time duration of the midamble being known to the system beforehand in accordance with the standardised burst form.

In the following, the Power Detector and Integrator Circuit is described in more detail. The Power detector and Integrator circuit essentially consists of three main parts, a directional coupler 17, the analogue detector circuit 19 and the Analog to Digital Conversion circuit 22. The highest possible coupling factor is used to minimise through loss and reduce the power dissipation in the attenuator 18 connected to the coupled output arm. The coupler 17 must also drive the detector means 19 with sufficient power so as to maintain adequate sensitivity at the lowest power level, i.e. Power Level 15.

The output from the coupled port of the directional coupler 17 drives the detector means 19, e.g. detector, diode matching circuit, via the attenuator 18 of at least 6 dB which is used to improve the detector match and set the required power level at the input to the detector 19. The matching circuit is tuned to achieve high sensitivity at low power levels over the GSM 900 band.

Following the detector diode matching circuit is the integrator 21 which may include a temperature compensation circuit. The purpose of the integrator 21 is to average out the amplitude variations inherent in the EDGE signal and hence to reduce the error in the sampled power measurement.

The output of the integrator 21 feeds into the ADC 22 which converts the detected analog voltage into a digital output which may be a word having an appropriate number of bits. In the case of this single loop example, this digital word is fed directly into the power control chip 13, 23, where it is compared to a reference.

With regard to Detector Dynamic Range, the power detector circuit is implemented to operate monotonically over at least the range of 36 dB, from 3 dB above to 33 dB below the nominal full power output.

The power detector circuit preferably provides an absolute accuracy of ±0.5 dB over the power range 0 to 17 dB below nominal PA GMSK full power output (PA=Power Amplifier). In addition it preferably provides an absolute accuracy of ±1.0 dB over the power range from 17 dB to 33 dB below nominal full power output.

Figure 4:
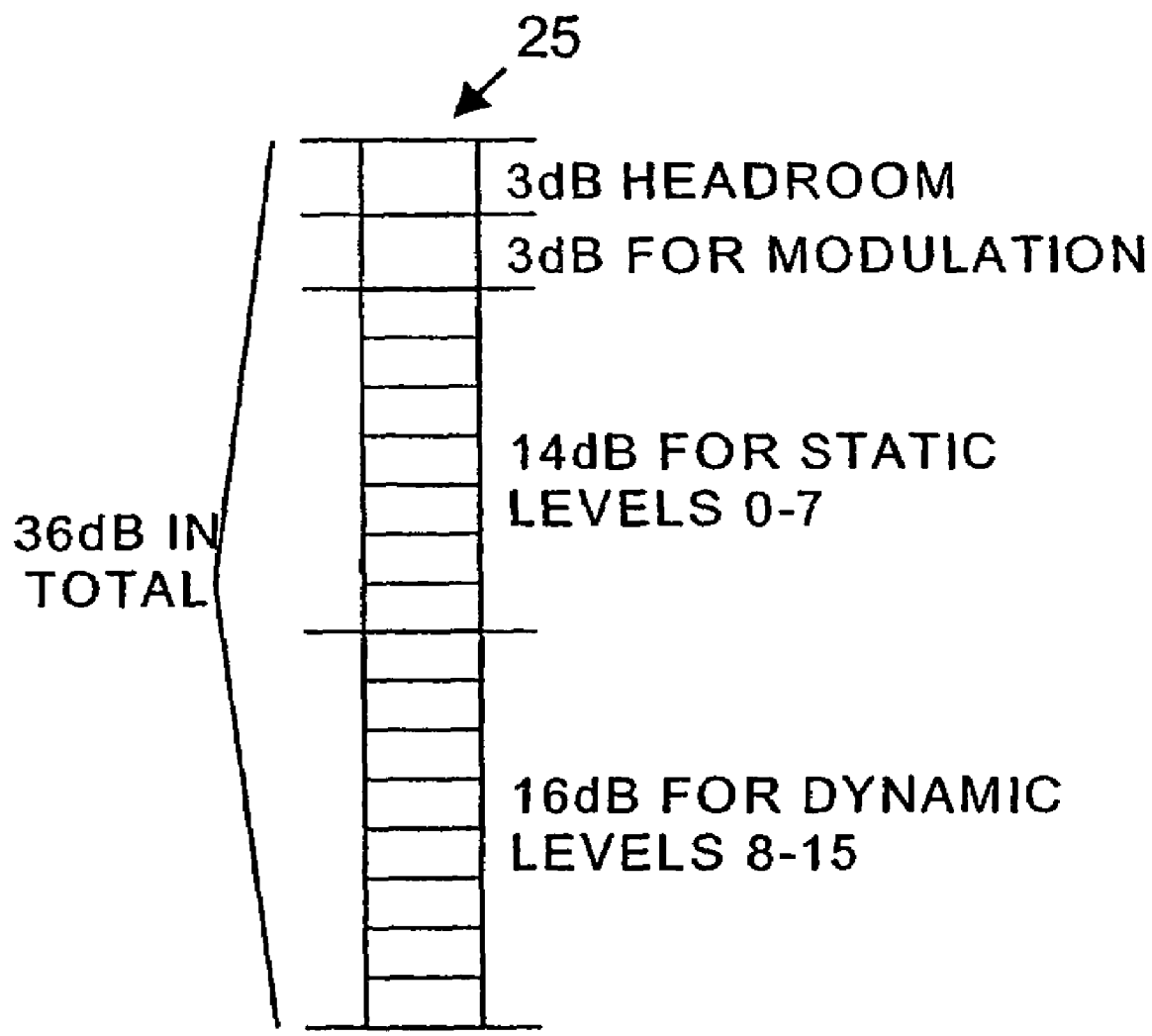
FIG. 4 shows the detector dynamic range in an embodiment of the present invention.

The breakdown of the 36 dB detector range requirement is represented graphically in FIG. 4 (dynamic range 25) and is as follows:

3 dB for PA overdrive under fault conditions (no power accuracy requirement);

3 dB difference in mean power level between EDGE and GMSK modulation;

14 dB for the 7 static power steps (i.e. 8 power levels);

16 dB for the 8 dynamic power steps (i.e. 9 power levels).

In the following, details of the algorithm stored in algorithm section 24 are described. The algorithm maintains a table of gain values on various channels. The table index will be sent by the baseband board 12 to the power control means. The algorithm is told the static power level (i.e. the maximum transmit power of the basestation due to geographical constraints) in an initialisation message and is told the desired output power in each downlink burst message. The algorithm calculates the dynamic power level, i.e. the amount by which the base station is backed-off from the static power, which is used to digitally scale the modulator output.

The gain value stored in the table is preferably provided as a ramp or staircase with small increments, e.g. in ⅛th dB increments, in the range from 0 to e.g. 31.875 dB. This gain value is used to drive a step attenuator in the transmit chain, with a step size of either 0.5 dB, 1 dB or 2 dB. The remainder when the gain table setting is divided by the step attenuator resolutions is used to digitally scale the modulator output.

The output power is measured during the training sequence 10, preferably using either an integrator to average the power or by taking multiple readings, and the gain table setting is updated based on the difference between the wanted and measured power.

If the difference is less than some pre-determined value ådB, the value is left unchanged. If greater than ådB but less than 2 dB, the table is moved by one step (i.e. ⅛th dB) in the appropriate direction. If 2 dB or more, the table is stepped by 16 (2 dB), to accelerate convergence during warm-up. If the power level is below some programmable cut-off, the table is only stepped by one unit if the difference is 2 dB or more, to account for the detector being less accurate at low power levels.

The mapping from channel number to table index will be done by the baseband software. A simple but effective mapping would be to assign three channels to each table entry, but a better mapping could be determined if the number and distribution of channels is known.

The static attenuation, i.e. the control of the static power levels, Power Levels 0 to 6, is effected by attenuator 14, e.g. a single 30 dB, 2 dB step digital attenuator, at RF. The attenuator 14 receives its information from the power control chip 13, e.g. ASIC. This attenuator 14 is also used to take out unit to unit variations in components and the effects of temperature.

Figure 5:
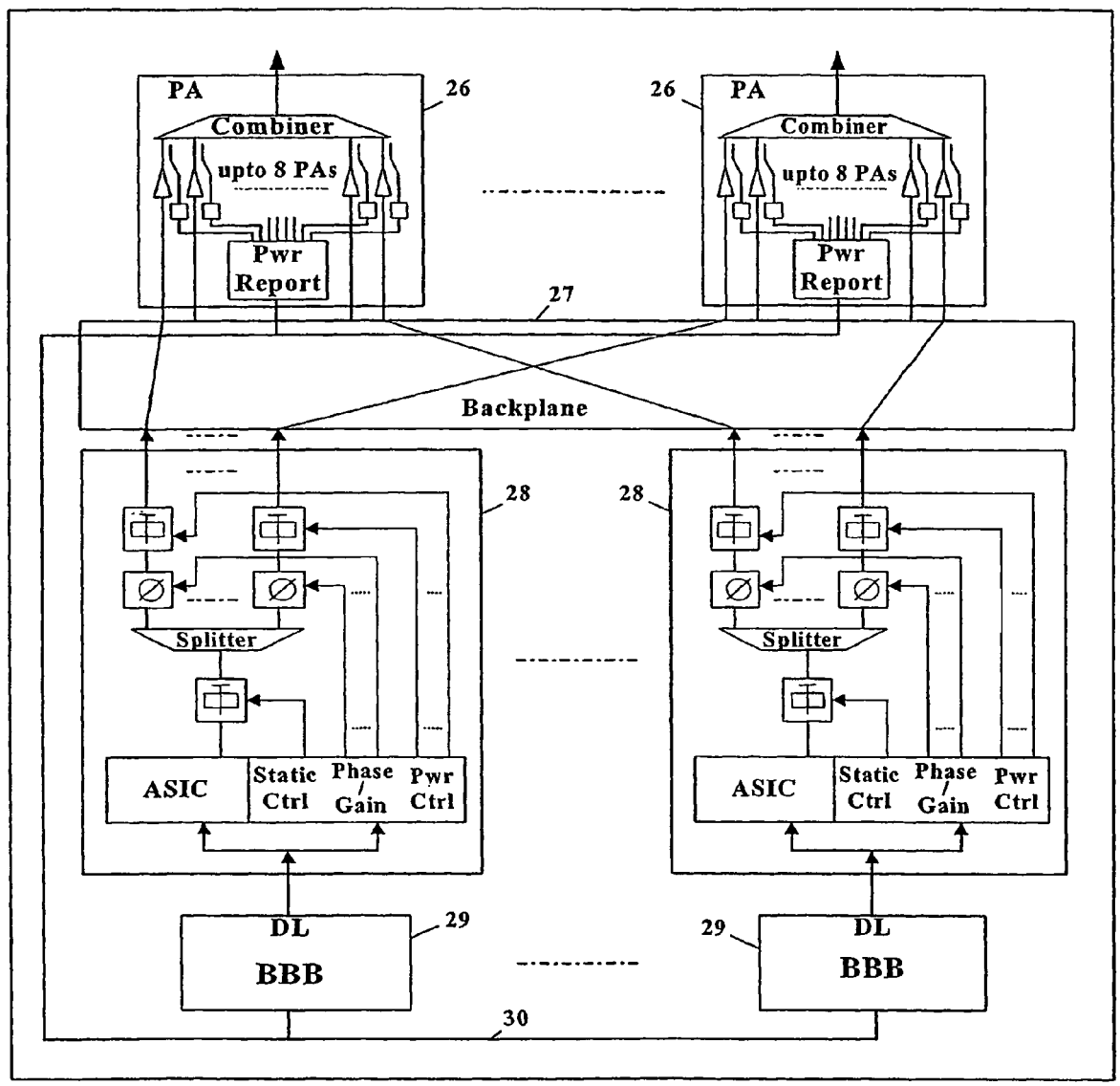
FIG. 5 illustrates a further embodiment of the present invention implemented for a smart antenna case.

FIG. 5 shows a further embodiment of the invention which includes multiple TRX's configured in a smart antenna implementation. Here the transmit section of the transceiver is split into three sections: TRX(s) 28, the interconnect matrix 27 and Power Amplifier module(s) 26. The detected output power information is then detected in the same manner as in the above described example but then passed from power report elements via line 30 to Baseband Boards 29 where it is used to adjust the power settings.

The method by which the detected data is passed back to the baseband module may be application specific.

There are for example up to eight antennas in the Smart Antenna case, so there will be up to eight power control loops. The C/I (Carrier to Interference ratio) can be improved by running the outer antennas at a lower power level, which reduces the sidelobe power. The power adjustment on the antenna array, called a beam taper, will be introduced by backing off the vector modulators in the control loops for the outer antennas. The vector modulators are also responsible for phasing the antennas and hence steering the beam.

The Smart Antenna system will require antenna calibration bursts to be sent, in the GSM idle slots. It is sufficient to use just these bursts to calibrate the power control loop, as long as a suitably smart power control algorithm is used. The simple measure-and-correct algorithm used in the non-smart case described above would possibly lead to unsatisfying results in some cases. Most gain variations in the transmit paths are going to be due to temperature changes in the PAs and couplers, so will be roughly independent of frequency. There are gain effects that depend strongly on frequency, such as temperature changes at the SAW (Surface Acoustic Wave) filter, but these will happen over a much longer timescale than PA temperature changes.

This leads to an algorithm which measures the error on one channel, corrects that channel, and then applies a proportion of that correction to all channels assuming that a large proportion of that error was frequency-independent. The process of exactly correcting an error will require a division operation, which is easiest done in a microprocessor or DSP, rather than implementing, as an alternative, the algorithm directly in hardware.

Gain control is preferably performed as a part of gain/phase calibration. The power control algorithm in the Smart Antenna situation is difficult to separate from the phase/gain calibration that is also occurring. The antenna calibration hardware will produce a set of phases and relative gains for each antenna path through a particular TRX. The power-measuring circuits in the PA's for power control will produce absolute powers for each PA output. There is a need to reconcile the absolute and relative power measurements, especially if they conflict. The power control operations will involve stepping attenuators in the different transmit chains, and this will alter the phase through that path, requiring another phase calibration.

Power/gain control can be done in four places in the transmit path, in the Smart Antenna option. These places are highlighted by arrows in FIG. 6.

The dynamic power is input, via line 33, to a digital multiplier 32 in a power control chip 31, e.g. ASIC. This gives fine, linear control of the output power of all antenna paths. Using this approach degrades the noise floor, so it can only be used for dynamic power setting plus other small increments.

A common step attenuator 34 gives coarse control over all paths, and will probably be used only for setting the static power level. A splitter 35 distributes the output signal of attenuator 34 to several antenna paths which each include a coarse path attenuator 36, a gain & phase adjuster 37 which may be implemented as a linear vector modulator, an attenuator 38 for feedback power control, a power amplifier 39, and an antenna 40.

Figure 8:
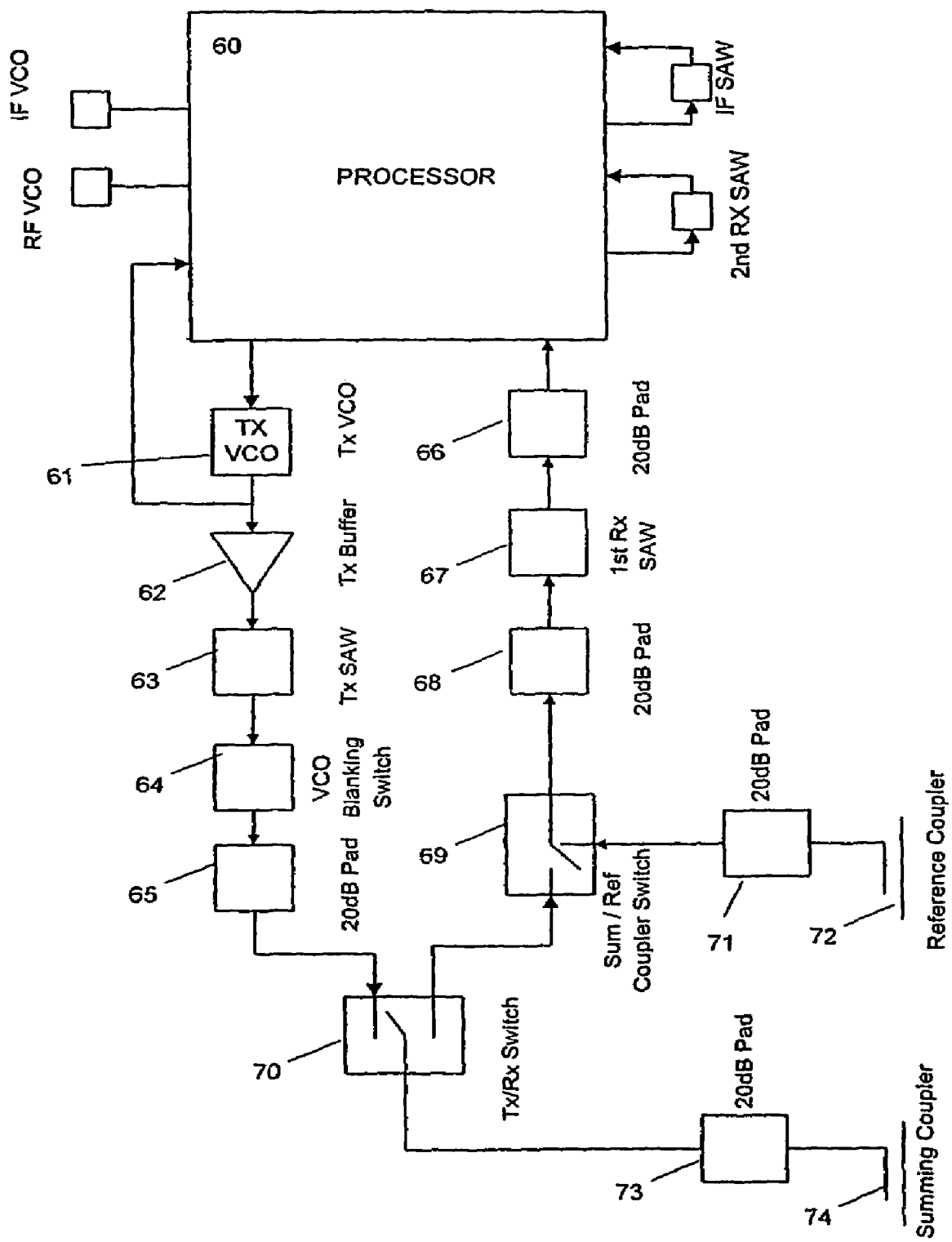

A reference coupler 72 is placed before the splitter 35, preferably at the line between the attenuator 34 and the splitter 35. This reference coupler 72 is connected to other circuit path as shown in FIG. 8.

The coarse path attenuators 36 give a good range, e.g. 30 dB, of attenuation, but in coarse steps of e.g. 2 dB, that will affect the phase of the signal. System must be calibrated after stepping this attenuator 36.

The gain & phase adjusters 37 can be assumed to be fine-step power controlling devices, which means that the device must have been characterised accurately. This table should allow phase and gain to be set independently of each other.

The optional autonomous attenuators 38 driven by temperature-sensing equipment in the power amplifiers 39 will only affect phase to a small degree, but this may be significant.

In the following, the algorithm is described. The algorithm maintains a table of gains, in the range 0 to 30 dB with a high precision for each TRX path and each channel setting in use. These gains are approximately equal to the amount of attenuation which has to be provided in the coarse path attenuator 36 and vector modulator 37, holding the common step attenuator 34 at the correct setting for this static power level, so that the maximum input to the digital multiplier (4095) will provide the correct static power level at the PA output. An approximation is preferably provided because the coarse path attenuator 36 will not have exactly 2 dB steps.

The inputs to the algorithm are the static power level, the dynamic level of this burst (i.e. the amount in dBs that it is backed-off from the maximum allowed power for this BTS), and the tapering of the antenna.

The common attenuator 34 is preferably set to the static power level. It is possible to account for gain drifts in the whole antenna array here, but this may be unnecessarily complicated.

The digital multiplier 32 is preferably set to $4095 \times 10^{d/20}$ where d=0, −2, −4, . . . is the dynamic power level in dB. The beam taper or profile should be added to the vector modulator settings. The taper cannot be done by changing the coarse path attenuators 36, because the taper can change from one timeslot to another, but the phase must remain constant for every timeslot between calibrations. The taper needs to be changeable to allow packet services to be broadcast to many recipients, while targeting traffic channels to a single user.

In the following, the architecture, function and interfaces of a calibration module 50 representing an embodiment of the invention and usable in the above described structure will be explained with reference to FIGS. 7 to 10.

The system supports Smart Antennas, which include an array of antennas to allow beam steering. Smart Antenna performance depends greatly on the accuracy of the relative phases and amplitudes of the signal fed to each antenna. The signals to each antenna customarily go through different paths (amplifiers, filters and cables) resulting in relative amplitude and phase errors between the paths. If these errors are not calibrated out by the system, the Smart Antenna performance is degraded.

This description deals with the internal design and interfaces for Calibration Module (CM) 50, the system which measures the path phase and amplitude errors and reports them to the TRXs to allow them to compensate for the errors.

The CM 50 is able to calibrate both transmit and receive paths of the BTS. The CM 50 is responsible for:
transmitter calibration involving receiving, demodulating and processing bursts transmitted by the TRXs within the BTS;
receiver calibration involving injection of GSM RF signals at the masthead which are received and processed within the TRXs of the BTS;
control of the calibration process including selection of TRX and frequency to calibrate, and timing of calibration bursts.

Figure 7:
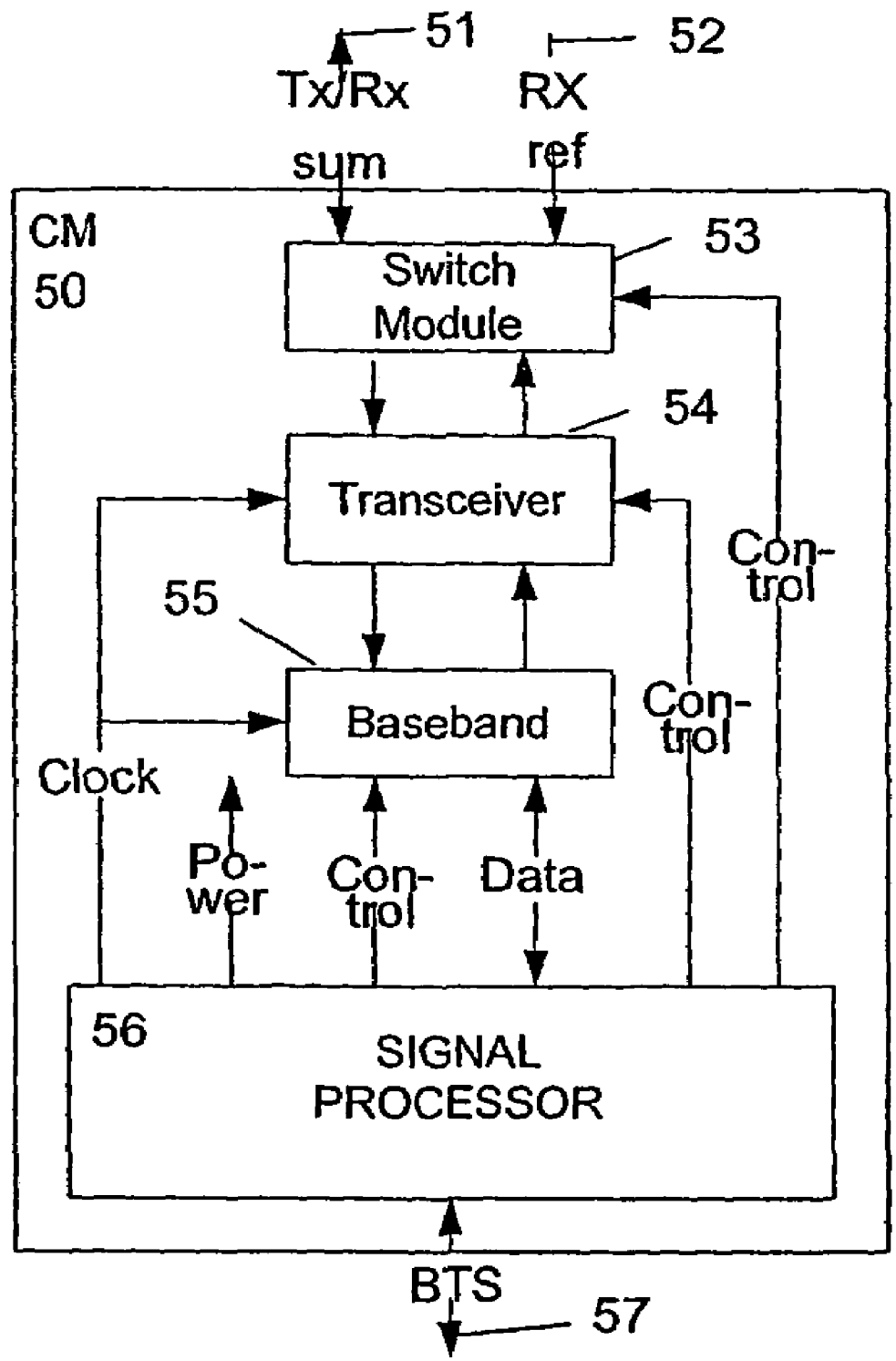
FIGS. 7, 8 show details of an embodiment of the present invention, and in particular illustrate the calibration structure.

The CM 50 shown in FIGS. 7, 8 is basically implemented for GSM 900 but may optionally be GSM 900 and GSM 1800 compatible, or may be designed for another communication standard.

The CM unit (CU) 50 contains the RF and sampling electronics required to measure the calibration bursts received from the BTS, and to generate bursts to send to the BTS.

FIGS. 7, 8 show the internal architecture of the CM 50 integrated e.g. in a MS (Mobile Station), i.e. the CM architecture based around (e.g GSM) MS transceiver and controller. In the following, the function of each block is defined.

The CM 50 has no power amplifier.

A RF Switch/Attenuator Block 53 is implemented as a switch block which consists of three RF switches 64, 69, 70. These RF switches configure the CM for transmit or receive, allow the sampling of signals from either a Summing Coupler 74 or from Reference Coupler 72, and blank off the transmitter during power up of a transmit VCO 61.

The reference coupler 72 is used by the CM 50 to measure a reference phase and gain value to compare to the measured gain and phase values from the N columns.

Figure 6:
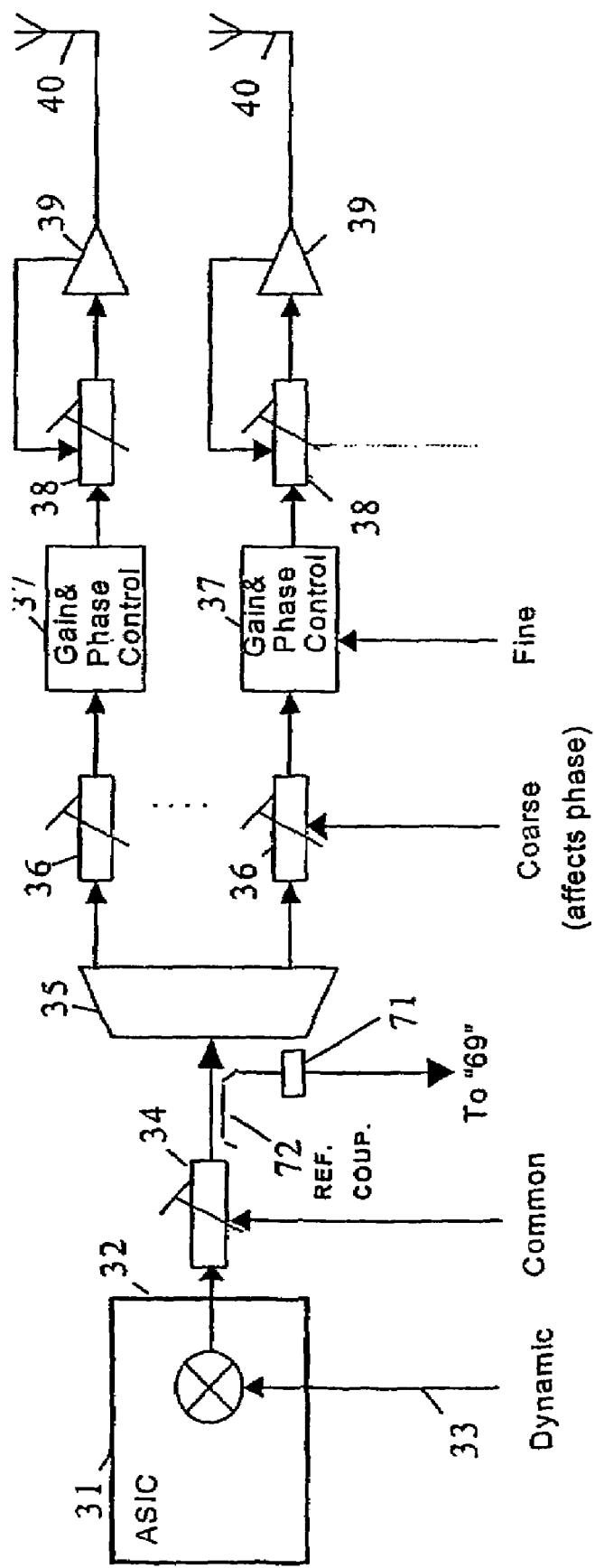
FIG. 6 shows another embodiment of the present invention illustrating the places for power control in a smart antenna structure.

The outer input/output (represented by a longer line) of summing coupler 74 shown in FIG. 8 is connected to input/output 51 shown in FIG. 7. Likewise, the output of reference coupler 72 shown in FIGS. 6, 8 is connected to input 52 shown in FIG. 7.

In detail, the switch block 53 contains:
a sample switch 69 for allowing the receiver input to sample either the Summing Coupler or the Reference Coupler inputs. The switch 69 is capable of rapidly switching between the two within e.g. 4 microseconds;
a transmit-receive switch 70 allowing either the transmitter or receiver to be connected to the Summing Coupler 74 port. The transmit-receive switch 70 is capable of switching within e.g. 4 microseconds;
a blanking switch 64 with high (e.g. 30 dB) isolation which can prevent transmission into the summing coupler by diverting transmit energy into a load. This is required because the translational loop of the GSM chip is activated in the slot before transmission occurs and it is necessary to isolate the transmitter while it is settling. This switch 64 is capable of switching within e.g. 4 microseconds; and attenuators to reduce the levels input and output from the CM to acceptable levels. Attenuation shall be distributed between the Summing Coupler and the BTS controller or BTS O&M.

The CM provides greater than 30 dB isolation between the Summing and Reference Coupler ports in both transmit and receive mode.

The switch block 53 also contains any driver circuits necessary for the switches if TTL drive from the BTS controller or BTS O&M is not sufficient.

A Transceiver 54, e.g. a GSM transceiver, provides the transceiver functions. The architecture of the transceiver 54 as well as the architecture of the switch block 53 (RF block architecture) are shown in FIG. 8.

The transceiver block 54 comprises an integrated mobile station chip (ASIC) with supporting RF components including attenuators, SAW filters and VCOs.

The transceiver block 54 receives RF signals from the Reference Coupler 72 and transmits or receives RF signals from the Summing Coupler 74. It uses as a reference the BTS system master clock.

The transceiver 54 is capable of reception followed by transmission with a e.g. three slot offset as used in standard GSM Mobile Stations.

Any GSM compliant mobile station RF processor chip 60 is suitable for the CM 50.

A baseband interface means (e.g. ASIC) 55 provides the interface between the processor 60 of the Calibration Module 50 and the BTS controller or BTS O&M, e.g. signal processor 56.

Specifically, the baseband means 55:
receives a bitstream from the BTS controller or BTS O&M 56 via a serial I/O (Input/Output) interface, performs the GMSK modulation and digital to analogue conversion required to send a GMSK analogue signal to the processor 60;
receives GMSK baseband I/Q analogue signals from the processor 60, filters and samples them to send a digital I and O signal to the BCC through the same serial I/O interface.

The baseband interface ASIC 55 is controlled by the same serial port used for data transmission with the addition of a small number of digital control lines.

The signal processing unit (signal processor) 56 provides hardware interfaces and host functions, the signal processing functions associated with calibration,and device drivers for the transceiver 54, processor 60, and the switch module 53.

In addition the unit 56 interfaces to the BTS controller or BTS O&M which preferably hosts the calibration control algorithm. The unit 56 may also interface directly with the BTS controller or BTS O&M which will execute the device drivers and signal processing functions in addition to the control algorithm.

The signal Processing unit is preferably slaved to the BTS system clock via the BTS controller or BTS O&M. The Signal Processing unit may be the BTS controller or BTS O&M mentioned above. The software is preferably designed to allow separation of the signal processing and BTS controller or BTS O&M software.

The CM Interfaces include external interfaces and internal interfaces. The external interfaces comprise RF interfaces of the summing coupler 74 (e.g. where the Summing Coupler feed cable leading to the BTS shell is connected to the summing coupler) and of the Reference Coupler 72, as well as BTS controller or BTS O&M interfaces.

As shown in FIG. 8, the CM 50 additionally comprises a Tx RF SAW (Surface Acoustic Wave) filter 63, a $1^{st}$ Rx RF SAW filter 67, a $2^{nd}$ Rx RF SAW filter having both its input and output connected to processor 60, an IF SAW filter having both its input and output connected to processor 60, an RF VCO and IF VCO connected to processor 60, a Tx VCO 61, a GSM Duplex switch 70, a 900 MHz RF switch 64, attenuators 65, 66, 68, 71, 73, buffers 62, etc.

The processor 60 is controlled by a 3 wire digital interface. This interface will be used to configure the processor 60 between transmit and receive modes, and set the synthesisers to relevant frequency.

The baseband block 55 uses a 6 wire bi-directional serial interface. The interface clock is output from the block 55 and is an integer divisor of the e.g. 13 MHz input master clock, with the divisor set by an internal register. The interface can be set in transmit or receive mode.

The interface between Switch Block 53 and BCC comprises 3 control lines to command the sample switch 69, the Tx/Rx switch 70 and the blanking switch 64.

The internal interfaces of CM 50 include an analog differential I/O interface between the Converter Block of baseband block 55 and the Transceiver Block. 54, as well as an RF interface between the Transceiver Block 54 and the Switch Block 53.

In the following, the function of the CM 50 will be described.

The measurement of calibration basically has two parts, TX and Rx. Both preferably use a simple passive coupling network in the antenna array and a calibration board which works at mobile frequencies, e.g. the RF from a mobile station as in this implementation.

Figure 10:
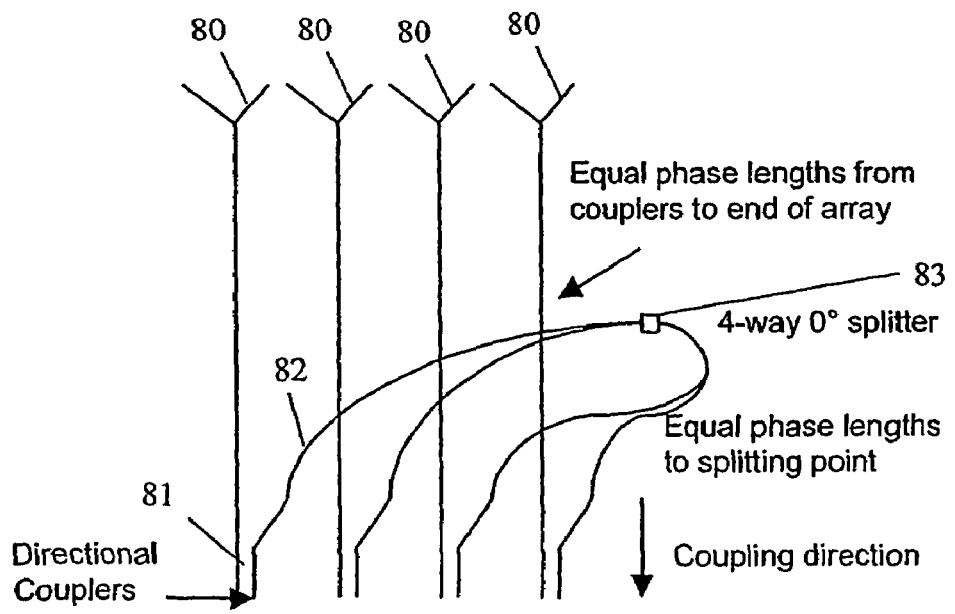
FIG. 10 shows a coupled antenna array usable in the embodiments of the present invention.

FIG. 10 shows the coupling array. Four antennas 80 are shown.

The number of antennas depends of course on the actual requirements and may be greater or smaller than four. Each antenna 80 is coupled with a directional coupler 81 each of which directionally couples the antenna signals (received or transmitted) to an associated line 82. All four lines 82 are connected to a 4-way 0° splitter 83 so that the signals applied to one antenna 80 are coupled, with zero phase shift, to all other antennas 80 as well. Equal phase lengths from couplers 81 to end of array are provided. Likewise, the array is structured so as to provide equal phase lengths to the splitting point. The coupling direction is illustrated by an arrow.

To calibrate the transmit side the BTS transmits GSM dummy bursts to the calibration board. To calibrate the Receive side the calibration board transmits dummy bursts to the BTS. With processing, e.g. DSP processing, the relative gain and phase values can be calculated.

During normal BTS operation, calibration takes place using the idle slots which occur once per multiframe for GSM TCH/F (TCH=Traffic Channel), HSCSD and GPRS traffic channels. Half rate channels do not have this idle slot, and so half rate traffic on a given TRX is managed to ensure some TCH/F channels are present, allowing calibration.

During BTS start-up, calibration takes place using every frame to reduce calibration time. Each TRX shall be calibrated at each frequency in use on the BTS.

Transmit calibration may use a technique of Sequential Phase Inversion, where a series of bursts transmitted by the TRX, following splitting into the N antenna paths, are sequentially inverted by the Gain-Phase Adjusters. These sequentially inverted signals are measured and summed at the mast-head by the Summing Coupler 74 and passed to the CM unit for down-conversion, sampling and subsequent signal processing.

Preferably, transmit calibration uses a technique (method) which relies on sequentially turning off some, preferably 3, of all the columns, preferably 4 columns, and measuring the phase differences. As this is done on idle channels there is no performance degradation.

For Receive calibration, a (e.g. GSM) dummy burst is generated within the BTS controller and passed to the converter and transceiver blocks for modulation onto the required GSM carrier. This burst is received in each branch of the TRX. The amplitude and phase differences between each path are measured by the TRX and used as the new receive calibration offset.

The BTS controller is responsible for overall control of the calibration process including
  configuring the CM 50,
  triggering individual calibrations,
  signal processing of transmit calibration bursts,
  tracking calibration status of the TRXs within the BTS.

For Transmit Calibration Control in a Smart Antenna system, the BTS controller executes the Calibration Control application which manages the calibration process and interfaces with the CM 50 and the TRX baseband within the BTS.

The BTS controller maintains a calibration status table containing each TRX and frequency within the BTS. Calibration of a given (TRX, frequency) combination is scheduled according to this table with the oldest calibrations receiving highest priority. In the case of slow frequency hopping (SFH) the Calibration Control application uses an opportunistic approach where several (TRX, frequency) calibrations may be in progress at any one time.

The steps involved in transmit calibration are:
1. select the TRX most in need of calibration by a weighted sum of calibrations not yet started, calibrations in progress, calibrations completed,
2. calculate which frequencies in the hopping pattern may be used at the current FN,
3. select the available frequency most in need of calibration on the chosen TRX, based on factors such as age of calibration, current interim status of the calibration,
4. send a calibration message to the TRX under calibration configuring the state of the gain/phase adjusts for the wanted timeslot. For each burst, one of the N branches will be active, with the phase adjuster set to 0° and gain to a nominal value. The other branches will be set to maximum attenuation,
5. configure the CM to receive dummy burst(s) at the required frequency by commanding the CM synthesisers to move to the required frequency, the T/R switch to move to its receive position and the sample switch to move to the Summing port,
6. receive and store digital samples of the first e.g. 70 symbols of the dummy burst,
7. after e.g. 70 symbols of the burst, command the sample switch to move from Summing to Reference ports,
8. receive and store digital samples of e.g. 70 further symbols, 9. repeat steps 6, 7 and 8 for the N idle slots required to calibrate an N antenna system,
10. following the receipt of samples of the N bursts execute a calibration algorithm, e.g. an algorithm for calculating the relative phase and gain differences between the N paths for the selected TRX and frequency.

As an example, following receipt of samples of the N bursts the CM 50 performs decorrelation on all of the bursts. For each burst there will be an amplitude and phase calculation for the 70 symbols of the reference port and one for the 70 symbols from the active antenna column. By subtracting reference amplitude and phase from summing port reference and phase an absolute amplitude and phase is generated. Once all N columns have been processed, one of the columns (normally one of the end ones) is used as the origin, with its' phase and get set as zero, with the other N columns being offset from this.

11. send a_calibration_MEASURE message to the TRX under calibration, containing the N calibration values,
12. monitor TRX and CM for calibration related alarms.

The calibration burst format needs to be known by both the BTS and CM receiver. One pre-defined burst is the dummy burst, described in the GSM specifications 05.02 as a unique sequence of bits, with tail bits and guard period bits. This burst format shall be used for the calibration.

The BTS controller or BTS O&M executes the Calibration Signal Processing algorithms which process received GSM bursts to derive amplitude and phase corrections. This involves correlating the received samples with GMSK modulated dummy burst samples stored within the BTS controller or BTS O&M.

Furthermore, a Timing Recovery is provided. There is always a time delay between the transmission of the calibration signal and its reception. This delay varies with time and can cause calibration error.

Figure 9:
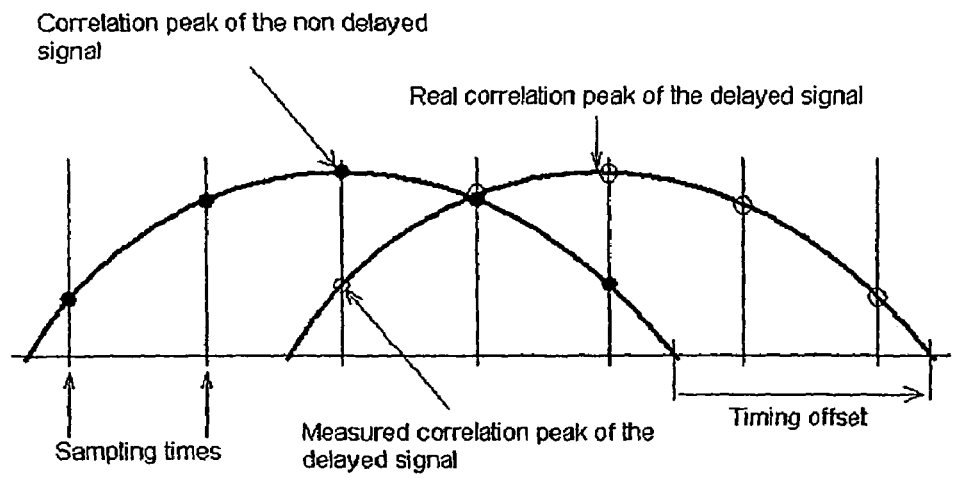
FIG. 9 shows signals and their correlation peaks.

FIG. 9 shows the non-delayed signal and the delayed signal and their correlation peaks, and illustrates the time shift between the real and measured correlation peaks of these signals with and without timing offset. The vertical lines represent the sampling times. The timing offset is shown by a double-headed arrow and in this example corresponds to two sampling intervals.

Simulations have shown that a timing offset of a quarter of a symbol for the signal received from the summing coupler 74 is acceptable. The following timing recovery method is preferably used to stay within this range.

Calibration at the time of power-up of the system or transmitter TRX (Power up calibration):
First iteration: Correlate the received signal with the expected signal (with no timing offset) to give the timing offset to 1 symbol accuracy,
Second iteration: The Expected Arrival Time of the signal is modified by +/−½ symbol according to the sign of the measured timing offset,
Third iteration: The Expected Arrival Time of the signal is modified by +/−¼ symbol according to the sign of the measured timing offset.

On-going calibration during operation: The Expected Arrival Time of the signal is modified by +/−¼ symbol according to the sign of the measured timing offset. The timing offset shall be considered frequency independent but TRX dependent.

A Phase Reference Recovery is provided. The Phase Reference Recovery algorithm is used to correct for the random phase offset of successive bursts, which is a consequence of the use of "ping pong" synthesisers within the TRX.

The algorithm correlates dummy burst samples measured from the Reference Coupler with the stored reference to calculate the phase offset of the TRX synthesiser.

Preferably, a Receive Calibration is likewise provided. The calibration process may be implemented in a customary manner.

For achieving the calibration control, in a Smart Antenna system, the BTS controller or BTS O&M executes a Calibration Control application which manages the calibration process and interfaces with the CM and the TRXs within the BTS.

The BCC maintains a calibration status table containing each TRX and frequency within the BTS. Calibration of a given (TRX, frequency) combination is scheduled according to this table with the oldest calibrations receiving highest priority. In the case of slow frequency hopping (SFH) the Calibration Control application uses an opportunistic approach to calibrate the most appropriate (TRX, frequency) combination.

Receive calibration executes once per frame using Slot 7 of frames where FN mod 26=0 (FN=Frame Number). The following steps are executed:
1. select the TRX most in need of calibration by a weighted sum of calibrations not yet started, calibrations in progress, calibrations completed,
2. calculate which frequencies in the hopping pattern may be used at the current FN,
3. select the available frequency most in need of calibration on the chosen TRX, based on factors such as age of calibration, current interim status of the calibration,
4. send the configuration message to the TRX under calibration, configuring FN, ARFCN, timeslot 7 and AGC level. On receipt of this command the TRX shall prepare to move to the appropriate frequency and to set the Gain Phase Adjusters to null and the AGCs to the required setting,
5. the BTS controller or BTS O&M shall command the CM processor 60 to the appropriate frequency and configure the CM 50 for transmit mode. The blanking switch 64 shall isolate the transmit VCO 61 from the CM output. The Tx/Rx switch 70 shall remain in Rx mode,
6. the BTS controller or BTS O&M shall load the dummy burst bits into the input buffer of block 55 via the serial interface. At the start of the appropriate timeslot the BTS controller or BTS O&M shall trigger the modulation and D/A conversion process within the block 55 and switch the blanking switch 64 and the Tx/Rx switch 70 to connect the processor 60 Tx with the CM output,
7. each TRX shall receive the dummy burst on its N branches and execute the Receive Calibration algorithm to derive new calibration values.

The format of the Receive bursts is such that the receive bursts consist of standard GSM dummy bursts.

Modulation and digital to analogue conversion of the burst are generated by the DAC within the block 55 and filtered by the on-board reconstruction filters. As regards burst timing, the burst transmitted by the CM is time-aligned to within ±1 symbol period of a nominal zero timing advance value, i.e. the burst transmitted by the CM is 468.75±1 symbol periods delayed from the burst received by the CM 50.

To correct for the small timing offset caused by cable delays, the CM transmit burst timing is corrected by a Timing Recovery offset value $T_0$. The $T_0$ shall be applied in such a way that if the transmit calibration Timing Recovery offset acts to retard the measurement of the BTS transmit burst, the CM transmit burst shall be advanced by the same offset.

The burst power of the output of the processor 60 transmitter is attenuated, e.g. by 10 dB, within the CM 50 resulting in a correspondingly attenuated power at the CM output port.

The TRX executes a Calibration Signal Processing algorithm which processes GSM bursts received on each antenna path to derive amplitude and phase corrections. This involves correlating the received samples with a reference dummy burst stored within the TRX BBB (BaseBand Board). The TRX calculates relative phase and amplitude differences between its N receiver paths. The calibration procedure within the receiver does not assume that the signal injected by the CM has the same amplitude or phase between consecutive calibration bursts.

The calibration of the BTS Rx is constrained by the minimum C/I (carrier to interference) which is required to achieve accurate calibration:

1. the maximum power of any unwanted signal which will be received by the BTS Rx,
2. the C/I required to achieve accurate calibration of the wanted signal (from simulation),
3. these give the required minimum calibration carrier power at the BTS input. The calibration carrier needs to be switched "off" between calibrations, the power level when it is off preferably is in the noise floor of the BTS Rx,
4-6. there are various constant gains and losses for the couplers and combiners in the system,
7. these give the wanted carrier power level at the CM transmitter output,
8. a blanking switch is provided to put the CM output power into the noise floor of the BTS, taking account of the gains and losses in the system,
9. an attenuator is provided to reduce the CM VCO output power to the level required,
10. the RF chip VCO has a fixed output power.

The Tx calibration includes two parts: measurement at the summing coupler 74 and at the reference coupler 72. Neither puts enough power into the CM Rx front end to cause intermodulation products. Attenuators are provided:

1. The TRX output at maximum and minimum power,
2-5. various gains and losses from the cables and couplers in the system,
6. This is the maximum and minimum power present at the CM Rx input,
7. an attenuator is provided to bring the power at the CM Rx input down to the maximum input power which can be input to the CM Rx.

The same calculation is performed for the summing coupler 74, with a different combination of couplers and cables taking account of the different position in the BTS of the reference coupler 72.

The CM 50 may be integrated with the BTS controller or BTS O&M, hence the CM 50 may need to conform with BTS controller or BTS O&M dimensions. The Calibration Module may be duplicated for redundancy.

The active components of the CM 50 are preferably designed for e.g. GSM handsets-and have very low power consumption Although the invention has been described above with reference to specific embodiments, the scope of the invention also covers any alterations, additions, modifications, and omissions of the disclosed features.

The invention claimed is:

1. An apparatus, comprising:
   a calibrator configured to calibrate the transmission or receiving power of a transmitter or receiver in a mobile communication network, the calibrator including a summer connected to an antenna array of the transmitted or receiver, wherein the summer is configured to sum transmission or reception signals, and a common calibrator configured to calibrate the summed signals, wherein the apparatus is configured to transmit or receive burst signals for the antenna array and the burst signals include a training sequence;
   a power control loop configured to control the output power of the power amplifier, the power control loop containing a detector configured to detect the output of the power amplifier, and a controller configured to control the detector so as to detect the output of the power amplifier only during a time of output of the training sequence using a time-window to activate the detector only during the training sequence and to stop the detection function of the detector during the other times, wherein the apparatus is configured to control the power based on the detected output power; and
   a power detection section configured to issue a control signal which is applied to a control input of the detector, wherein the power detection section is configured to generate the control signal with a timing so as to operate the detector only when the power amplifier outputs the training sequence, wherein the power detection section is configured to generate the control signal by providing a time delay between start of a burst signal and start of the control signal sufficient so as to open the detection function of the detector only when the first bits of the training sequence are occurring at the input of the detector, and to close the time window for detecting the power amplifier output signal at or before the occurrence of the last bits of the training sequence.

2. The apparatus according to claim 1, wherein the controller is configured to issue a control signal that is applied to a control input of the detector, and the controller is configured to generate the control signal with a timing so as to operate the detector only when the power amplifier outputs the fixed training sequence.

3. The apparatus according to claim 1, further comprising:
   a transmission branch;
   a reception branch; and
   a first switch configured to switch the connection of the summer either to the transmission branch or to the reception branch.

4. The apparatus according to claim 3, further comprising:
   a second switch configured to switch the connection of the transmission branch either to the summer or first switch, or to a reference coupler configured to supply a reference signal to the transmission branch.

5. The apparatus according to claim 3, further comprising:
   a further switch provided in the transmission branch configured to temporarily blank the transmission branch.

6. The apparatus_according to claim 1, wherein the apparatus is configured to measure, for transmit calibration, idle timeslots with only one column active.

7. The apparatus according to claim 1, wherein, when, for receive calibration, a dummy burst is generated and modulated onto a carrier, the apparatus is configured to receive the dummy burst in each branch of a transmitter, to measure the amplitude and phase differences between each path are measured, and to use the result of such measurement as a new receive calibration offset.

8. The apparatus according to claim 1, further comprising a chipset of a mobile terminal which is used for calibration in conjunction with the calibrator.

9. The apparatus according to claim 1, further comprising:
   a passive coupling network in the antenna array and a calibration board that works at radio frequencies in conjunction with the calibrator.

10. The apparatus according to claim 1, further comprising:
    an open loop static power control configured to control the output power of the power amplifier, wherein the open loop static power control comprises a controllable attenuator arranged upstream of the input side of the power amplifier, the controllable attenuator configured to be controlled by the controller.

11. The apparatus according to claim 1, wherein the apparatus is configured to set the output power based on information measured in a previous timeslot and to avoid making power corrections during a measured timeslot.

12. The apparatus according to claim 1, wherein the apparatus is comprised in a smart antenna structure comprising several antennas, including a power amplifier in each antenna path, a common attenuator, and a splitter arranged between the common attenuator and the antenna paths, each power amplifier including an embodiment of the power control loop.

13. A method, comprising:
calibrating the power of a transmitter or receiver in a mobile communication network comprising an antenna array;
transmitting burst signals to, or receiving by, the antenna array, wherein the burst signals comprise a fixed training sequence, and the transmitter or receiver comprising a power amplifier;
calibrating the transmission or receiving power of the transmitter or receiver, wherein the calibrating comprises summing transmission or reception signals of the antenna array, and commonly calibrating the summed signals; and
controlling the output power of the power amplifier by a power control loop, wherein controlling includes detecting the output of the power amplifier in a controlled manner so as to detect the output of the power amplifier only during the time of output of the training sequence using a time-window to activate the detector only during the training sequence and to stop the detection function of the detector during the other times, and controlling the power based on the detected output power;
issuing a control signal which is applied to a control input of the detector, wherein the issuing comprises generating the control signal with a timing so as to operate the detector only when the power amplifier outputs the training sequence, wherein the timing is configured to provide a time delay between start of a burst signal and start of the control signal sufficient so as to open the detection function of the detector only when the first bits of the training sequence are occurring at the input of the detector, and to close the time window for detecting the power amplifier output signal at or before the occurrence of the last bits of the training sequence.

14. The method according to claim 13, wherein the controlling comprises issuing a control signal that controls the detecting, and generating the control signal with a timing so as to detect only when the power amplifier outputs the fixed training sequence.

15. The method according to claim 13, further comprising:
a first switching a connection of a summer for performing the summing either to a transmission branch or to a reception branch.

16. The method according to claim 15, further comprising:
a second switching the connection of the transmission branch either to the summer or to a first switch for performing the first switching, or to a reference coupler for supplying a reference signal to the transmission branch.

17. The method according to claim 15, further comprising: temporarily blanking the transmission branch.

18. The method according to claim 13, further comprising: measuring idle timeslots for transmit calibration with only one column active.

19. The method according to claim 13, further comprising, for receive calibration:
generating a dummy burst;
modulating the dummy burst onto a carrier;
receiving the dummy burst in each branch of a transmitter;
measuring the amplitude and phase differences between each path; and
using the result of the measuring as a new receive calibration offset.

20. The method according to claim 13, further comprising: setting the output power based on information measured in a previous timeslot, and abstaining from making power corrections during a measured timeslot.

21. The method according to claim 13, further comprising: performing the method in a smart antenna structure comprising several antennas, including a power amplifier in each antenna path, a common attenuator, and a splitter arranged between the common attenuator and the antenna paths, each power amplifier including a power control loop.

22. An apparatus, comprising:
calibration means for calibrating the transmission or receiving power of a transmitter or receiver in a mobile communication network, the calibration means including a summing means, connected to an antenna array of the transmitted or receiver, for summing transmission or reception signals, and a common calibrating means for calibrating the summed signals, wherein the apparatus is configured to transmit or receive burst signals for the antenna array and the burst signals include a training sequence;
power control loop means for controlling the output power of the power amplifier, the power control loop containing a detector means for detecting the output of the power amplifier, and a control means for controlling the detector means so as to detect the output of the power amplifier only during a time of output of the training sequence using a time-window means for activating the detector means only during the training sequence and for stopping the detection function of the detector means during the other times, wherein the apparatus is configured to control the power based on the detected output power; and
power detection means for issuing a control signal which is applied to a control input of the detector means, wherein the issuing comprises generating the control signal with a timing so as to operate the detector only when the power amplifier outputs the training sequence, wherein the timing is configured to provide a time delay between start of a burst signal and start of the control signal sufficient so as to open the detection function of the detector only when the first bits of the training sequence are occurring at the input of the detector, and to close the time window for detecting the power amplifier output signal at or before the occurrence of the last bits of the training sequence.

* * * * *